US012342532B2

(12) United States Patent
Li

(10) Patent No.: US 12,342,532 B2
(45) Date of Patent: Jun. 24, 2025

(54) SEMICONDUCTOR STRUCTURE AND METHOD FOR FABRICATING A DEVICE HAVING SOURCE REGION WITH DIFFERENT DOPING TYPES IN HORIZONTAL DIRECTION

(71) Applicant: CHANGXIN MEMORY TECHNOLOGIES, INC., Hefei (CN)

(72) Inventor: Min Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 504 days.

(21) Appl. No.: 17/946,063

(22) Filed: Sep. 16, 2022

(65) Prior Publication Data

US 2023/0005930 A1    Jan. 5, 2023

(30) Foreign Application Priority Data

May 24, 2022  (CN) .......................... 202210566719.6

(51) Int. Cl.
*H10B 12/00*   (2023.01)

(52) U.S. Cl.
CPC ......... *H10B 12/34* (2023.02); *H10B 12/0335* (2023.02); *H10B 12/315* (2023.02); *H10B 12/482* (2023.02); *H10B 12/488* (2023.02)

(58) Field of Classification Search
CPC .............. H10B 12/0383; H10B 12/395; H10B 12/482; H10B 12/488
USPC ................................................. 257/135, 302
See application file for complete search history.

(56) References Cited

U.S. PATENT DOCUMENTS 9,837,405 B1 * 12/2017 Cheng ................... H01L 21/477
11,164,770 B1    11/2021 Or-Bach et al.

* cited by examiner

*Primary Examiner* — Hoai V Pham
(74) *Attorney, Agent, or Firm* — Kilpatrick Townsend & Stockton LLP

(57) ABSTRACT

Embodiments relate to a semiconductor structure and a method for fabricating the same. The method includes: providing a substrate having a first surface and a second surface opposite to each other; and forming, in the substrate, active areas arranged in an array and an isolation structure configured to isolate the active areas. Each of the active areas includes a source region, a drain region, and a channel region positioned between the source region and the drain region, where the source region is exposed to the first surface. The source region includes a first region and a second region distributed in a horizontal direction, where the first region and the second region have different doping types, and the drain region and the source region are not positioned on the same surface.

16 Claims, 11 Drawing Sheets

SEMICONDUCTOR STRUCTURE AND METHOD FOR FABRICATING A DEVICE HAVING SOURCE REGION WITH DIFFERENT DOPING TYPES IN HORIZONTAL DIRECTION

CROSS-REFERENCE TO RELATED APPLICATION

This application claims priority to Chinese Patent Application No. 202210566719.6, titled "SEMICONDUCTOR STRUCTURE AND METHOD FOR FABRICATING SAME" and filed to the State Patent Intellectual Property Office on May 24, 2022, the entire contents of which are incorporated herein by reference.

TECHNICAL FIELD

The present disclosure relates to the field of semiconductor manufacturing technology, and more particularly, to a semiconductor structure and a method for fabricating the same.

BACKGROUND

As a semiconductor apparatus commonly used in electronic devices such as computers, a dynamic random access memory (DRAM) includes a memory cell array configured to store data and a peripheral circuit positioned at a periphery of the memory cell array. In general, each memory cell includes a word line structure, a bit line structure, and a capacitor. A word line voltage of the word line structure can control on or off of a transistor, such that data information stored in the capacitor can be read or the data information can write into the capacitor via the bit line structure.

With size decrease of the DRAM and high performance requirements for a peripheral core circuit, a gate all around (GAA) structure and a stacked structure where the capacitor is formed on a back surface of a wafer emerge and receive more and more attention.

SUMMARY

On this basis, it is necessary to provide a semiconductor structure and a method for fabricating the same in view of technical problems pointed out in the background art.

One embodiment of the present disclosure discloses a semiconductor structure, including a substrate, which includes active areas arranged in an array and an isolation structure configured to isolate the active areas. The substrate has a first surface and a second surface opposite to each other. Each of the active areas includes a source region, a drain region, and a channel region positioned between the source region and the drain region, where the source region is exposed to the first surface, and the drain region and the source region are not positioned on the same surface. The source region includes a first region and a second region distributed in a horizontal direction, where the first region and the second region have different doping types.

One embodiment of the present disclosure further discloses a method for fabricating a semiconductor structure, including: providing a substrate having a first surface and a second surface opposite to each other; and forming, in the substrate, active areas arranged in an array and an isolation structure configured to isolate the active areas. Each of the active areas includes a source region, a drain region, and a channel region positioned between the source region and the drain region, where the source region is exposed to the first surface. The source region includes a first region and a second region distributed in a horizontal direction, where the first region and the second region have different doping types, and the drain region and the source region are not positioned on the same surface.

BRIEF DESCRIPTION OF THE DRAWINGS

To describe the technical solutions of the embodiments of the present disclosure more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

For ease of understanding the present disclosure, the present disclosure will be described more fully hereinafter with reference to the accompanying drawings. Embodiments of the present disclosure are presented in the accompanying drawings. However, the present disclosure may be embodied in many different forms and should not be limited to the embodiments set forth herein. Rather, these embodiments are provided such that disclosed contents of the present disclosure are understood more thoroughly and completely.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. As used herein, the term "and/or" includes any and all combinations of one or more of the associated listed items.

When describing positional relationship, unless otherwise specified, when an element such as a layer, film or substrate is referred to as being "on" another film layer, it can be directly on the other film layer or intervening film layer may also be present. Further, when a layer is referred to as being "under" another layer, it can be directly under the other layer, or one or more intervening layers may also be present. It is also to be understood that when a layer is referred to as being "between" two layers, it can be the only one between the two layers, or one or more intervening layers may also be present.

In the case of "comprising", "having", and "including" as described herein, another component may also be added unless a clearly defined term is used, such as "only", "consisting of", etc. Unless mentioned to the contrary, terms in the singular form may include the plural form and cannot be understood as one in number.

With size decrease of the DRAM and high performance requirements for a peripheral core circuit, a gate all around (GAA) structure and a stacked structure where the capacitor is formed on a back surface of a wafer emerge and receive more and more attention. However, the above two structures have a common disadvantage, that is, a floating body effect. Charges stored in the transistor easily cause loss of information in the memory cell, which may likely cause a history effect. That is, a threshold voltage of the transistor operates depending on its previous state. To solve the above problems, embodiments of the present disclosure disclose a semiconductor structure and a method for fabricating the same.

Figure 1:
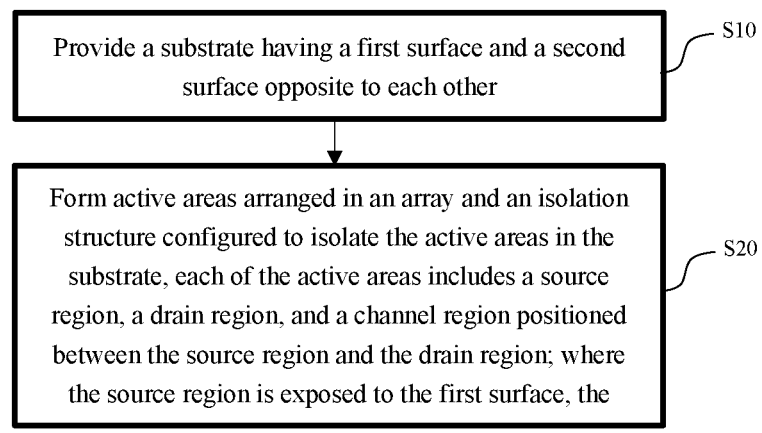
FIG. 1 is a flow block diagram of a method for fabricating a semiconductor structure according to an embodiment of the present disclosure.

As shown in FIG. 1, one embodiment of the present disclosure discloses a method for fabricating a semiconductor structure, including:

S10: providing a substrate having a first surface and a second surface opposite to each other; and S20: forming, in the substrate, active areas arranged in an array and an isolation structure 30 configured to isolate the active areas, where each of the active areas includes a source region, a drain region, and a channel region positioned between the source region and the drain region. The source region is exposed to the first surface, the source region includes a first region and a second region distributed in a horizontal direction, the first region and the second region have different doping types, and the drain region and the source region are not positioned on the same surface.

In Step S10, the substrate may include, but is not limited to, a silicon substrate or a silicon-on-insulator (SOI) substrate. The SOI substrate includes top layer silicon, a back substrate, and a buried oxide layer between the top layer silicon and the back substrate. In this embodiment, reference is made by taking an example where the substrate is the SOI substrate.

Figure 2:
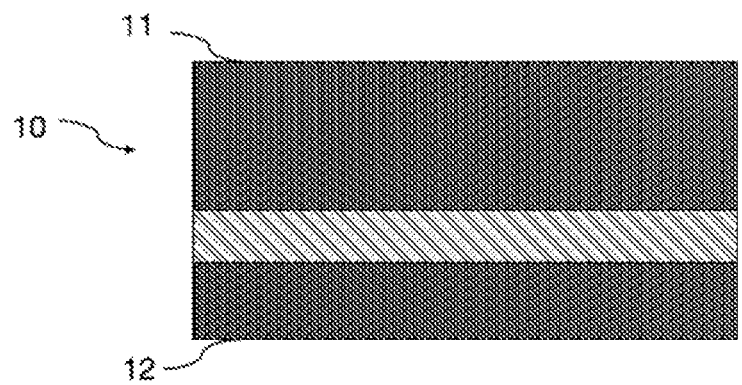
FIG. 2 is a schematic cross-sectional structural diagram of a substrate according to an embodiment of the present disclosure.

For example, as shown in FIG. 2, a substrate 10 has a first surface 11 and a second surface 12 opposite to each other.

Figure 3:
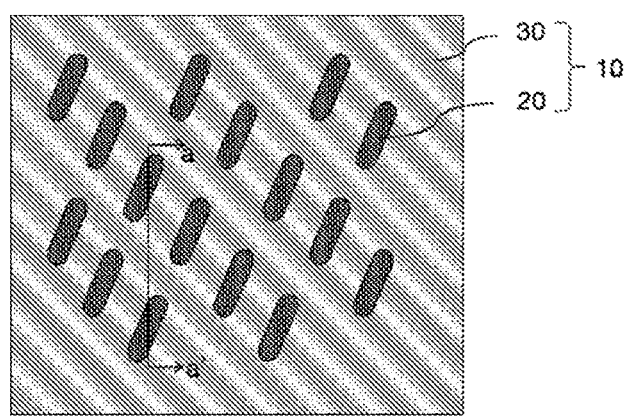
FIG. 3 is a vertical view of the semiconductor structure obtained after an active area and an isolation structure are formed in the substrate according to an embodiment of the present disclosure.

In Step S20, the isolation structure 30 is formed in the substrate 10, and the isolation structure 30 defines a plurality of active areas 20 (AA) in the substrate 10, where the plurality of active areas 20 may be arranged in a staggered array. For example, as shown in FIG. 3, the active areas 20 may be arranged in parallel with each other, and a center of one active area 20 may be adjacent to an end portion of another active area 20 adjacent thereto. As an example, the isolation structure 30 may be a shallow trench isolation (STI) structure, and a material for forming the STI structure may include a silicon oxide layer.

Figure 4:
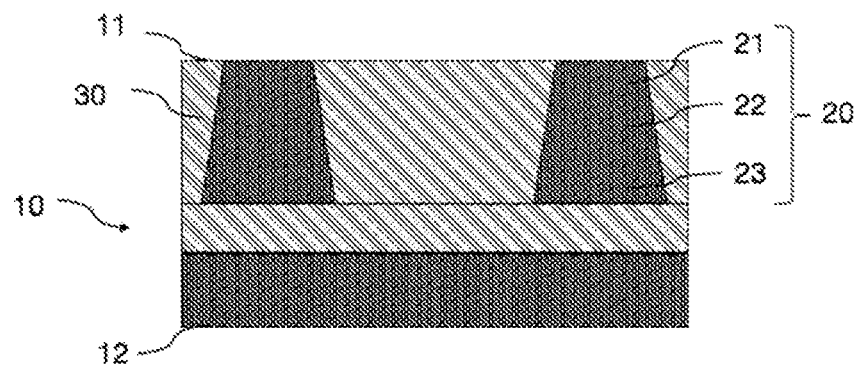
FIG. 4 is a schematic cross-sectional structural diagram taken along an aa' direction in FIG. 3.

A schematic cross-sectional structural diagram taken along an aa' direction in FIG. 3 is as shown in FIG. 4, each active area 20 includes a source region 21, a drain region 23, and channel region 22 between the source region 21 and the drain region 23, which are arranged along a vertical direction. The channel region 22 is perpendicular to the first surface 11 or the second surface 12, the source region 21 is exposed to the first surface 11, and the drain region 23 is positioned inside the SOI substrate and keeps away from the first surface 11.

For example, the drain region 23, the channel region 22 and the source region 21 may be formed by means of ion implantation or epitaxial doping, where the source region 21 has a first region and a second region having different doping types.

In some embodiments, the drain region 23 is heavily N-type doped, the first region is heavily N-type doped, the second region is heavily P-type doped, and the channel region 22 is P-type doped. The first region of the source region 21, the channel region 22 and the drain region 23 together form an NPN transistor, and the second region is electrically connected to the NPN transistor.

In some other embodiments, the drain region 23 is heavily P-type doped, the first region is heavily P-type doped, the second region is heavily N-type doped, and the channel region 22 is N-type doped. The first region of the source region 21, the channel region 22 and the drain region 23 together form a PNP transistor, and the second region is electrically connected to the PNP transistor.

In the method for fabricating the semiconductor structure, the first region and the second region having the different doping types are formed in the source region, and charges accumulated in a transistor structure may be released by means of the second region while the transistor structure is formed, to prevent a floating body effect and a history effect caused by accumulation of the charges in the transistor structure, such that device performance is improved.

In some embodiments, referring to FIG. 5 to FIG. 9, the method for fabricating the semiconductor structure further includes:

S30: forming a buried word line structure extending along a first direction in the substrate, where the buried word line structure is positioned on a side of the substrate close to the first surface and is embedded in the first region.

Figure 5:
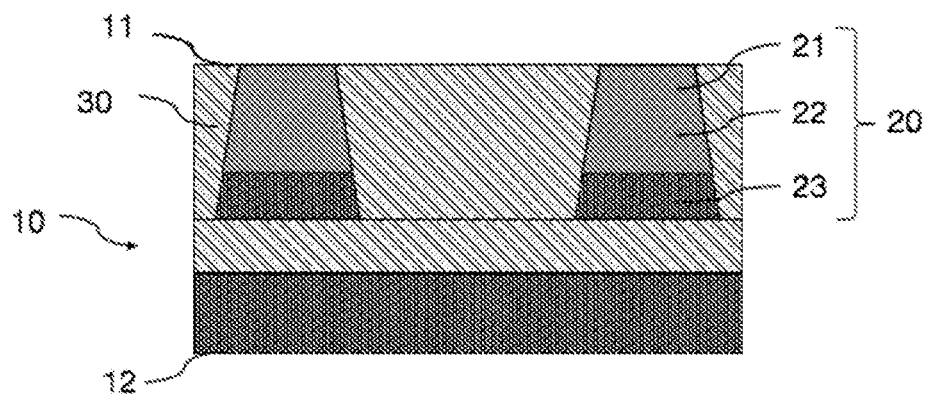
FIG. 5 is a schematic cross-sectional structural diagram of the semiconductor structure obtained after the first type of doping is performed on the source region and the channel region according to an embodiment of the present disclosure.

For example, as shown in FIG. 5, in some embodiments, before the buried word line structure 50 is formed, a first type of doping is performed on the source region 21 and the channel region 22, to form a first type of well region in the active area 20. For example, in this embodiment, the substrate 10 is an N-type substrate. Therefore, the first type may be a P-type, and a P-type well region is formed in the active area 20.

Figure 6:
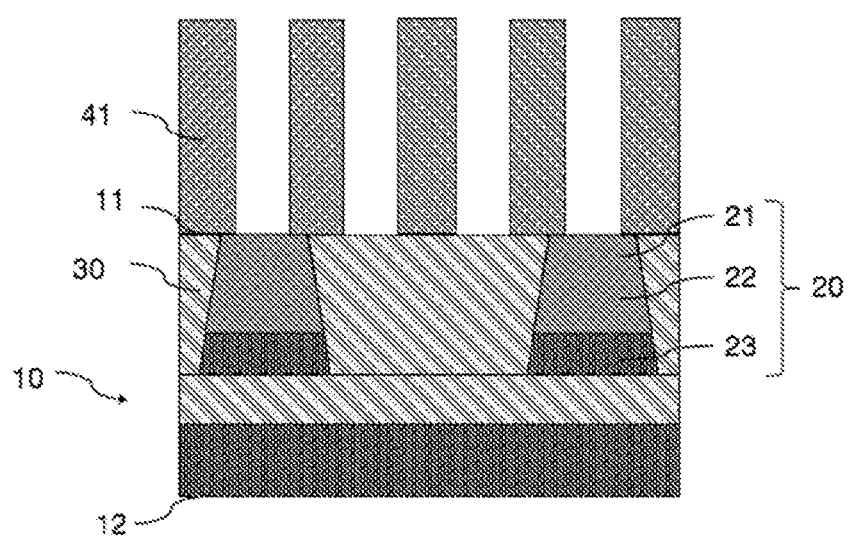
FIG. 6 is a schematic cross-sectional structural diagram of the semiconductor structure obtained after a first patterned mask layer is formed according to an embodiment of the present disclosure.

As shown in FIGS. 6 to 9, the step of forming the buried word line structure 50 include:

S31: forming a first patterned mask layer on the first surface, as shown in FIG. 6.

Figure 7:
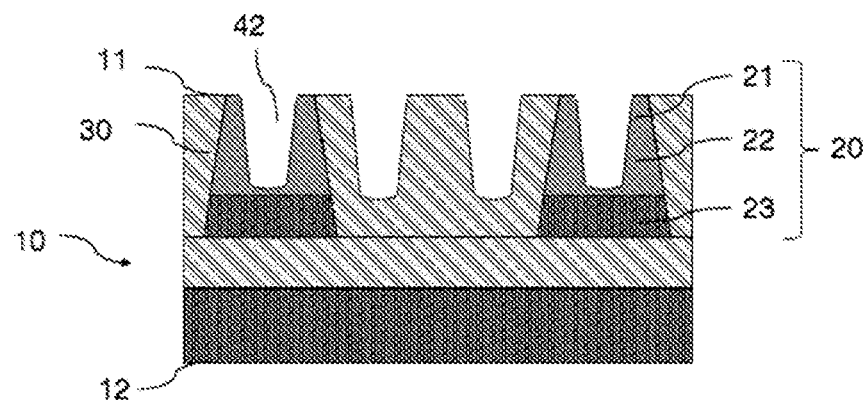
FIG. 7 is a schematic cross-sectional structural diagram of the semiconductor structure obtained after a word line trench is formed according to an embodiment of the present disclosure.

S32: forming a word line trench in the substrate on the basis of the first patterned mask layer, where the word line trench intersects with the first region, and a bottom of the word line trench extends to the channel region, as shown in FIG. 7.

Figure 8:
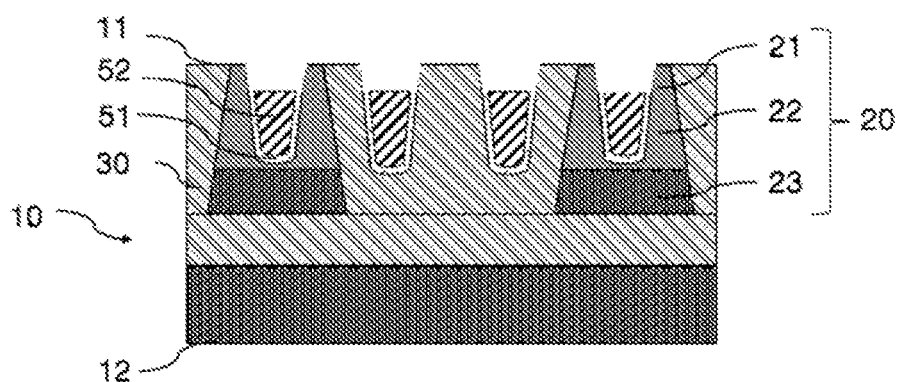
FIG. 8 is a schematic cross-sectional structural diagram of the semiconductor structure obtained after a word line conductive layer is formed according to an embodiment of the present disclosure.

S33: forming, in the word line trench, a word line conductive layer and a gate oxide layer wrapping a bottom and a side wall of the word line conductive layer, as shown in FIG. 8.

Figure 9:
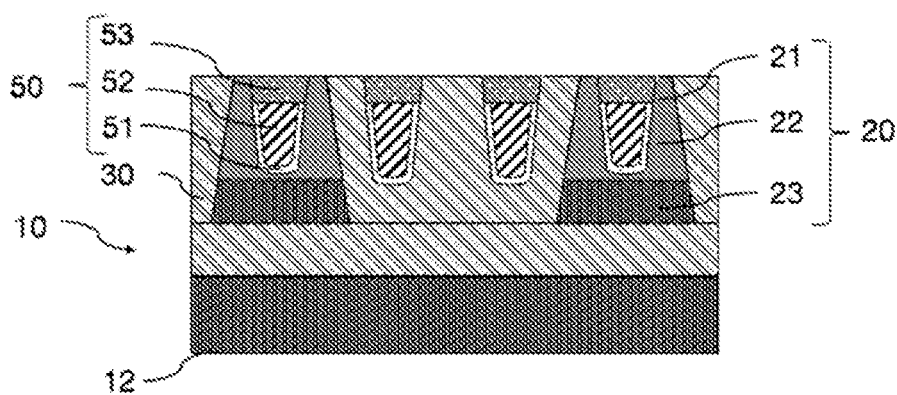
FIG. 9 is a schematic cross-sectional structural diagram of the semiconductor structure obtained after a word line dielectric layer is formed according to an embodiment of the present disclosure.

S34: forming a word line dielectric layer to cover the top of the word line conductive layer, as shown in FIG. 9.

In Step S31, as shown in FIG. 6, a first patterned mask layer 41 includes strip-shaped structures extending along a first direction, where the first direction is the same as an aa' direction in FIG. 3. A spacing between adjacent strip-shaped structures exposes the first surface 11. The first patterned mask layer 41 may be configured to define a size and a position of the buried word line structure 50.

In Step S32, as shown in FIG. 7, the substrate 10 is etched on the basis of the first patterned mask layer 41 to form a word line trench 42. The word line trench 42 intersects with the first region in the source region 21. The first region may be understood as a portion of the source region 21 close to two sides of the word line trench 42.

In some embodiments, the word line trench 42 may be formed in the substrate 10 by means of self-aligned double patterning (SADP) or self-aligned quadruple patterning (SAQP).

In Step S33, a gate oxide layer 51 may include, but is not limited to, a high dielectric constant material layer, such as a silicon oxide layer or a silicon oxynitride layer. For example, by means of a chemical vapor deposition process, an atomic layer deposition process, a plasma vapor deposition process, an In-Situ Steam Generation (ISSG) process, or a Rapid Thermal Oxidation (RTO) process, the silicon oxide layer may be formed on a bottom and a side wall of the word lines trench 42, to serve as the gate oxide layer 51.

For example, a gate oxide layer 51 is a silicon oxide layer. During formation of the gate oxide layer 51, the silicon oxide layer is easily formed on the first surface 11 of the substrate 10 to cover the source region 21, thereby affecting conductivity of the device. As a result, after the gate oxide layer 51 is formed, the silicon oxide layer on the first surface 11 may be removed by means of a chemical mechanical polishing (CMP) process or an etching process to expose the source region 21.

For example, a word line conductive layer 52 may be a metal layer with relatively low resistivity, such as germanium (Ge), tungsten (W), copper (Cu), or gold (Au). As an example, a metal material may be deposited in the word line trench 42 by means of a deposition process to form the word line conductive layer 52. The word line conductive layer 52 fills up the word line trench 42 and covers the first surface 11.

For example, the word line conductive layer 52 on the first surface 11 may be removed by means of a plasma etching process, and a thickness of the word line conductive layer 52 in the word line trench 42 is reduced to obtain a structure as shown in FIG. 8. In some embodiments, after the thickness of the word line conductive layer 52 is reduced, a portion of the gate oxide layer 51 may be removed by means of a wet etching process, such that a top of the gate oxide layer 51 is lower than the first surface 11 and higher than an upper surface of the word line conductive layer 52.

In some embodiments, the gate oxide layer 51 may be etched along a horizontal direction by means of an anisotropic plasma etching process to reduce a height of the gate oxide layer 51, such that the top of the gate oxide layer 51 is flush with the upper surface of the word line conductive layer 52. By etching the gate oxide layer 51 by means of the anisotropic plasma etching process, an etching direction may be mainly focused in the horizontal direction, and etching on the gate oxide layer 51 in a vertical direction is minimized, such that the gate oxide layer 51 is flush with the upper surface of the word line conductive layer 52 after being etched.

In Step S34, the word line dielectric layer 53 may be, for example, a silicon nitride layer. The word line dielectric layer 53 may be formed by means of the atomic layer deposition process or the chemical vapor deposition process to cover the word line conductive layer 52 and the gate oxide layer 51. For example, the upper surface of the word line dielectric layer 53 is flush with the first surface 11, as shown in FIG. 9.

Figure 10:
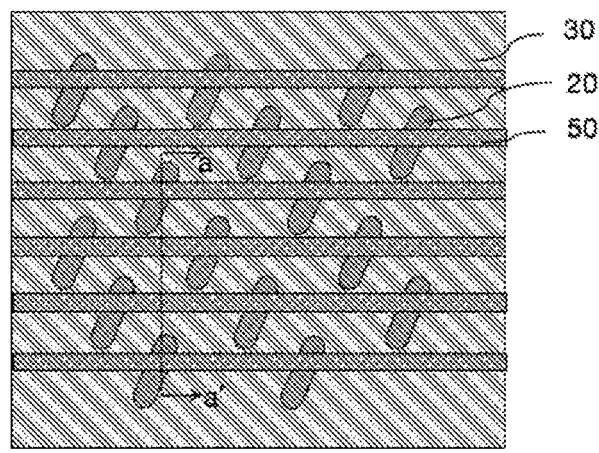
FIG. 10 is a vertical view of the semiconductor structure obtained after a buried word line structure 50 is formed according to an embodiment of the present disclosure.

After the buried word line structure 50 is formed, a vertical view of the structure obtained is shown in FIG. 10.

In the method for fabricating the semiconductor structure, by reducing the height of the gate oxide layer 51, it may be ensured that the word line dielectric layer 53 covers the word line conductive layer 52 and the gate oxide layer 51 simultaneously to prevent the gate oxide layer 51 from being exposed to the first surface 11 to be damaged by other etching process, such that the buried word line structure 50 is well protected.

Figure 11:
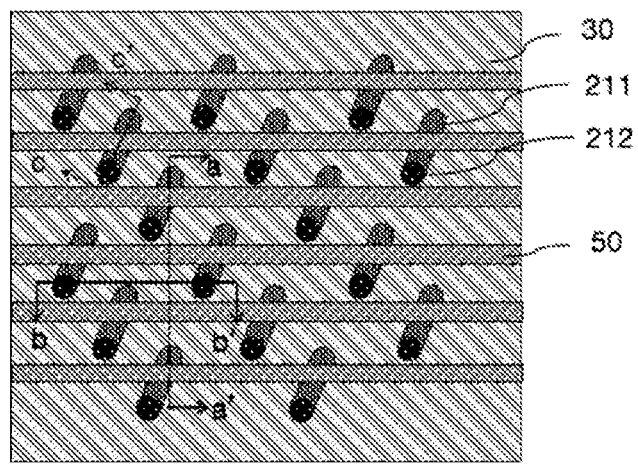
FIG. 11 is a vertical view of the semiconductor structure obtained after different types of doping are performed on a first region and a second region of the source region according to an embodiment of the present disclosure.

In some embodiments, after the buried word line structure 50 is formed, a second type of heavy doping is performed on the first region 211, and a first type of heavy doping is performed on the second region 212, such that the structure shown in FIG. 11 is obtained.

Figure 12:
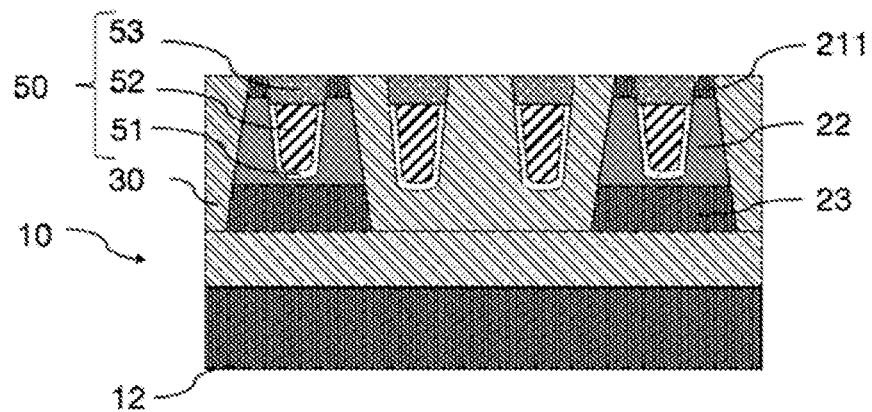
FIG. 12 is a schematic cross-sectional structural diagram taken along the aa' direction in FIG. 11.
Figure 13:
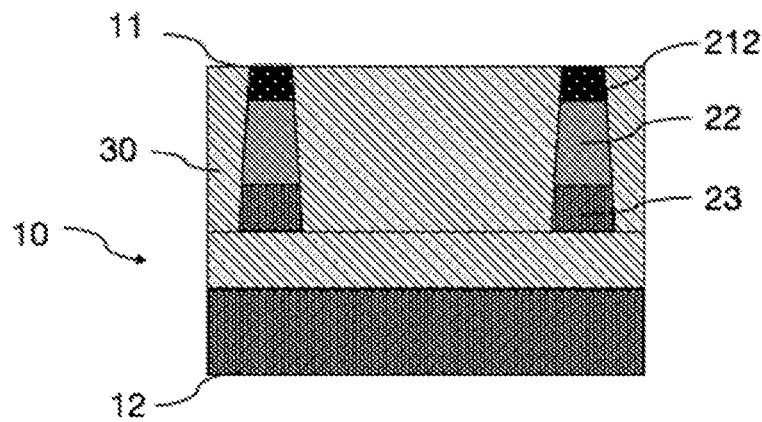
FIG. 13 is a schematic cross-sectional structural diagram taken along a bb' direction in FIG. 11.

FIG. 12 is a schematic cross-sectional structural diagram taken along the aa' direction in FIG. 11, and FIG. 13 is a schematic cross-sectional structural diagram taken along a bb' direction in FIG. 11. As can be known from FIG. 12 and FIG. 13, the first region 211 is positioned in a location of the source region 21 adjacent to the buried word line structure 50, and the buried word line structure 50 passes through the first region 211; and the second region 212 is positioned in a location of the source region 21 away from the buried word line structure 50, and the buried word line structure 50 does not intersect with the second region 212.

For example, in some embodiments, the substrate is an N-type substrate, the first type is P-type, and the second type is N-type. Therefore, an N-type heavily doped region is formed in the first region 211, and a P-type heavily doped region is formed in the second region 212. The first region 211, the channel region 22 and the drain region 23 together constitute an NPN transistor, the second region 212 is the P-type heavily doped region, and the second region 212 is electrically connected to the NPN transistor.

In some other embodiments, the substrate is a P-type substrate, the first type is N-type, and the second type is P-type. A PNP transistor and the second region 212 having N-type heavy doping may be formed by the above method.

In the method for fabricating the semiconductor structure, the first region and the second region having the different doping types are formed in the source region, the first region forms the transistor structure together with the channel region and the drain region, the second region may be electrically connected to the transistor structure, and the second region may be connected to other conductive structure to release the charges accumulated in the transistor structure. In this way, it is avoidable the floating body effect and the history effect caused by accumulation of the charges in the transistor structure, such that device performance is improved.

In some embodiments, as shown in FIGS. 14 to 18, the method for fabricating the semiconductor structure further includes:

S41: forming a bit line structure extending along the second direction on the first surface, where the bit line structure is electrically connected to the first region, and the second direction intersects with the first direction; and S42: forming conductive material layers on two opposite sides of the bit line structure, where the conductive material layers are electrically connected to the second region.

In Step S41, the step of forming the bit line structure 60 includes:

S411: forming a bit line conductive material layer, where the bit line conductive material layer covers the first surface 11 and the buried word line structure 50.

For example, the bit line conductive material layer includes a metal layer and a metal barrier layer, where the metal barrier layer is positioned between the metal layer and the first surface 11. The metal layer may be, for example, a tungsten layer, and the metal barrier layer may be, for example, a titanium layer or a titanium nitride layer. The metal barrier layer can prevent interpenetration between the metal layer and silicon.

S412: forming a second patterned mask layer on the upper surface of the bit line conductive material layer.

The second patterned mask layer includes a plurality of strip-like structures extending along the second direction, the strip-like structures are arranged at intervals, and the upper surface of the bit line conductive material layer is exposed between adjacent strip-like structures.

Figure 14:
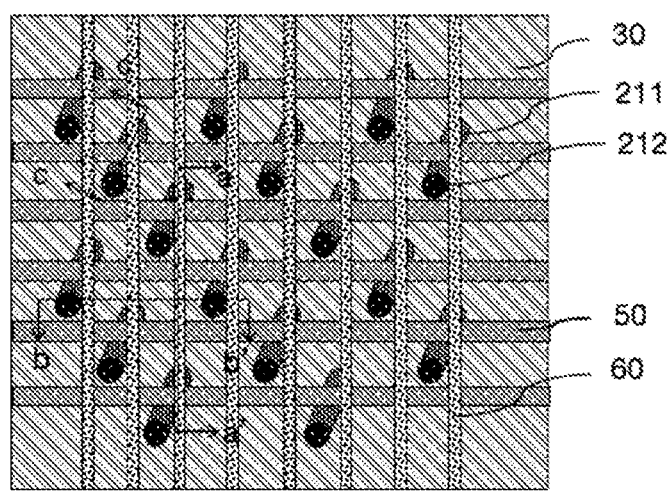
FIG. 14 is a vertical view of the semiconductor structure obtained after a bit line structure is formed according to an embodiment of the present disclosure.

S413: etching the bit line conductive material layer based on the second patterned mask layer until the first surface 11 is exposed, to form the bit line structure 60 extending along the second direction, as shown in FIG. 14.

Figure 15:
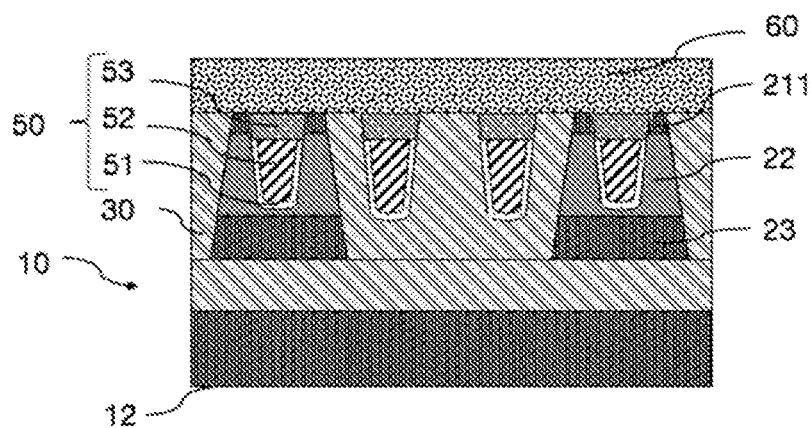
FIG. 15 is a schematic cross-sectional structural diagram taken along the aa' direction in FIG. 14.
Figure 16:
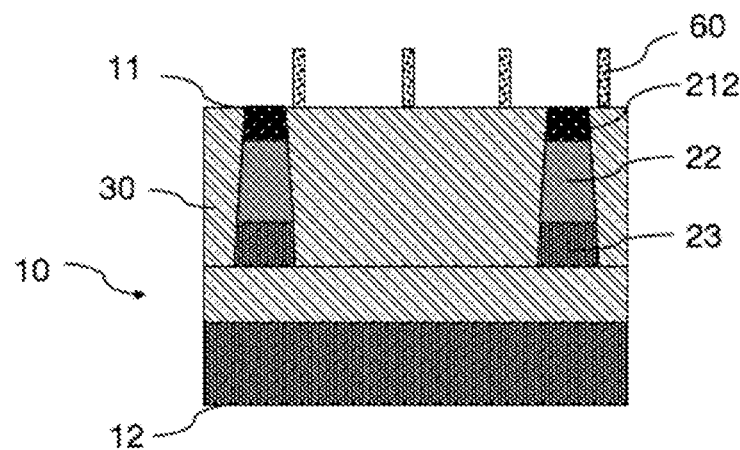
FIG. 16 is a schematic cross-sectional structural diagram taken along the bb' direction in FIG. 14.

FIG. 15 is a schematic cross-sectional structural diagram taken along the aa' direction in FIG. 14, and FIG. 16 is a schematic cross-sectional structural diagram taken along the bb' direction in FIG. 14. As can be known by referring to FIG. 15 and FIG. 16, the bit line structures 60 are arranged on the first surface 11 at intervals and extend along the second direction. The bit line structure 60 is electrically connected to the first region 211 of the source region 21, and the bit line structure 60 is not in contact with the second region 212 of the source region 21.

Figure 18:
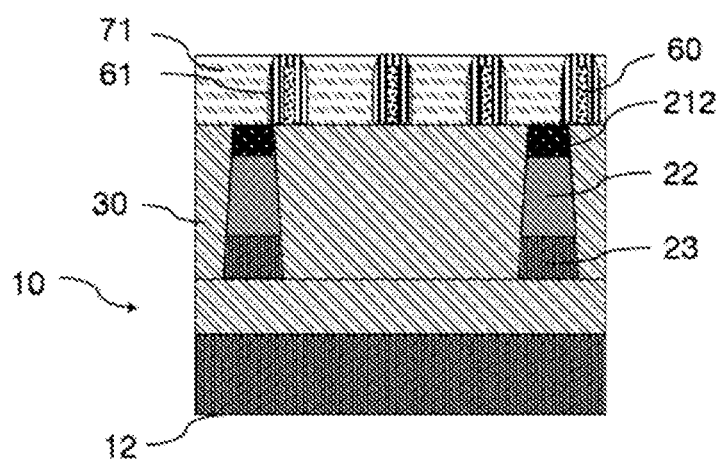
FIG. 18 is a schematic cross-sectional structural diagram of the semiconductor structure obtained after a conductive material layer is formed according to an embodiment of the present disclosure.

In Step S42, conductive material layers 71 are formed on two opposite sides of the bit line structure 60, and the conductive material layers 71 are electrically connected to the second region 212, as shown in FIG. 18.

Figure 17:
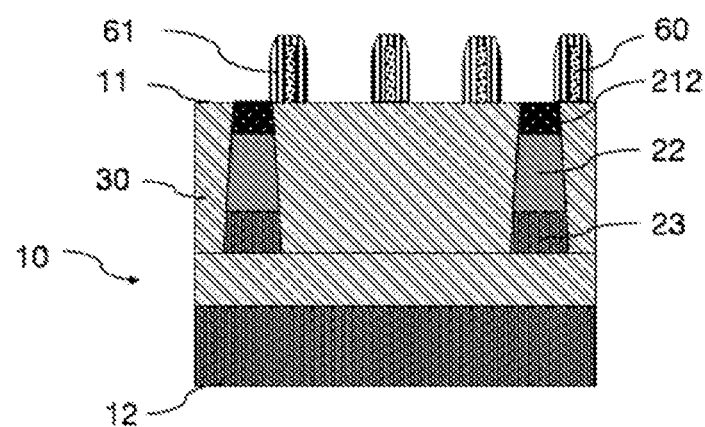
FIG. 17 is a schematic cross-sectional structural diagram of the semiconductor structure obtained after a bit line dielectric layer is formed according to an embodiment of the present disclosure.

For example, before the conductive material layers 71 are formed, a bit line dielectric layer 61 is formed on a top and a side wall of the bit line structure 60, as shown in FIG. 17. The bit line dielectric layer 61 may include, but is not limited to, a silicon nitride layer, a carbon layer, a silicon oxide layer, or a silicon oxynitride layer. As an example, the bit line dielectric layer 61 may be formed on the top and the side wall of the bit line structure 60 by means of an atomic layer deposition process or a chemical vapor deposition process first.

In some embodiments, the bit line dielectric layer 61 on the side wall of the bit line structure 60 covers the first region 211 and exposes the second region 212.

For example, the bit line dielectric layer 61 is the silicon nitride layer. After the bit line dielectric layer 61 is formed, the silicon nitride layer remained on the first surface 11 may be removed by means of a cleaning process to prevent the remained silicon nitride layer from blocking the second region 212.

For example, the conductive material layers 71 may be formed on two opposite sides of the bit line structure 60 by means of a deposition process. When an upper surface of the conductive material layer 71 is higher than that of the bit line dielectric layer 61, the conductive material layer 71 may be polished by means of the chemical mechanical polishing process, such that the upper surface of the conductive material layer 71 is flush with the upper surface of the bit line dielectric layer 61, as shown in FIG. 18. The conductive material layer 71 may include, but is not limited to, a copper layer or a tungsten layer.

In the method for fabricating the semiconductor structure, the conductive material layer 71 is formed between adjacent bit line structures 60, based on an electrical connection relationship between the conductive material layer 71 and the second region 212, the charges accumulated in the transistor structure may be released in time to avoid the floating body effect.

Figure 19:
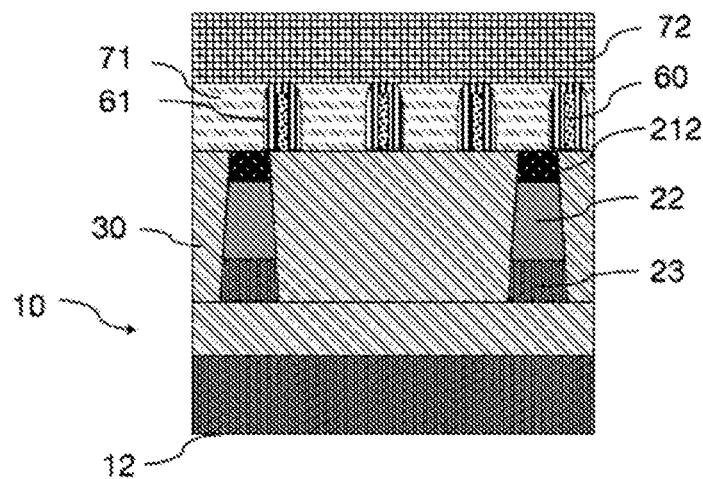
FIG. 19 is a schematic cross-sectional structural diagram of the semiconductor structure obtained after metal interconnect layer is formed according to an embodiment of the present disclosure.
Figure 20:
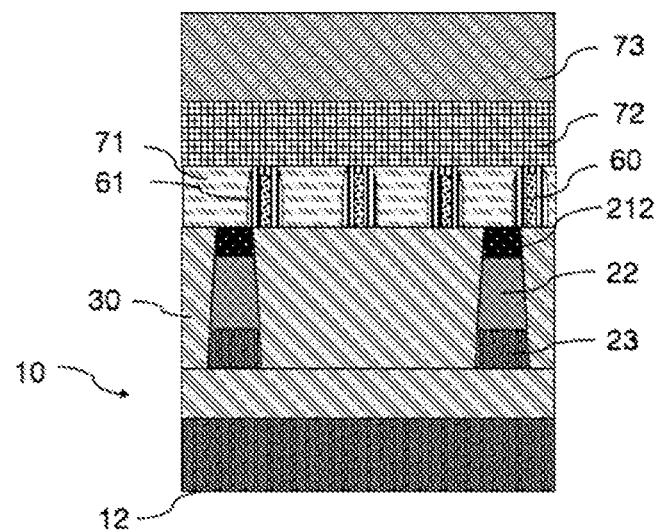
FIG. 20 is a schematic cross-sectional structural diagram taken along the bb' direction after bonding the semiconductor structure to a support substrate according to an embodiment of the present disclosure.

In some embodiments, as shown in FIG. 19 to FIG. 20, after the conductive material layer 71 is formed, the method further includes:

S51: forming a metal interconnect layer 72 covering the bit line dielectric layer 61 and the conductive material layer 71, as shown in FIG. 19.

S52: bonding an obtained structure to a support substrate 73, where a surface of the metal interconnect layer 72 away from the substrate 10 is a bonding surface, as shown in FIG. 20.

Figure 21:
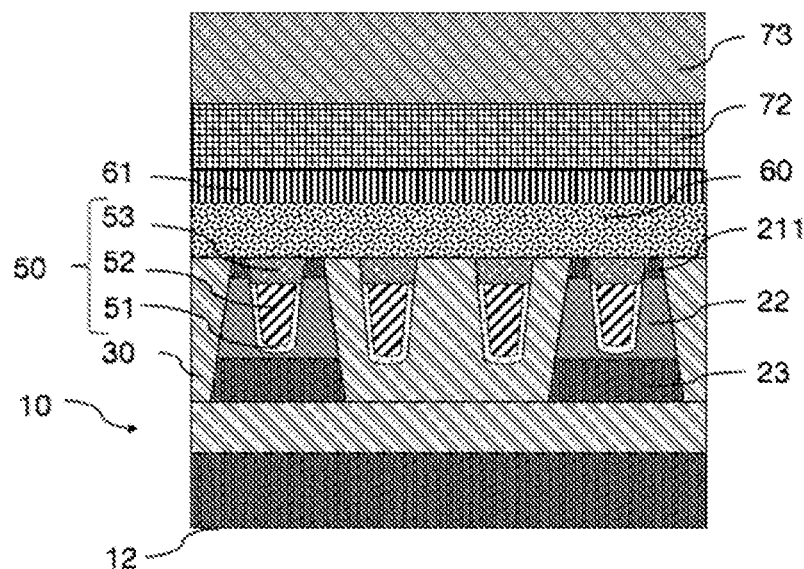
FIG. 21 is a schematic cross-sectional structural diagram taken along the aa' direction after bonding the semiconductor structure to the support substrate according to an embodiment of the present disclosure.

The metal interconnect layer 72 is electrically connected to the conductive material layer 71, such that the charges released from the transistor structure may be further conducted, via the metal interconnect layer 72, to the support substrate 73 for release. In addition, in this embodiment, by bonding the obtained structure to the support substrate 73, the obtained structure may be fixed to the support substrate 73 to facilitate fabrication of a capacitor on a side of the substrate 10 close to the second surface 12. For example, after the obtained structure is bonded to the support substrate 73, a schematic cross-sectional structural diagram taken along the aa' direction is as shown in FIG. 21.

Figure 22:
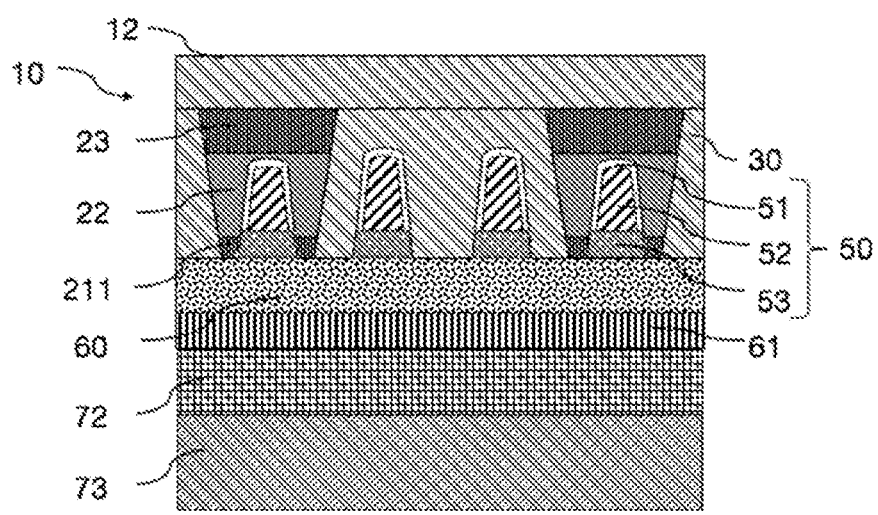
FIG. 22 is a schematic cross-sectional structural diagram of the semiconductor structure obtained after a back substrate is thinned according to an embodiment of the present disclosure.
Figure 23:
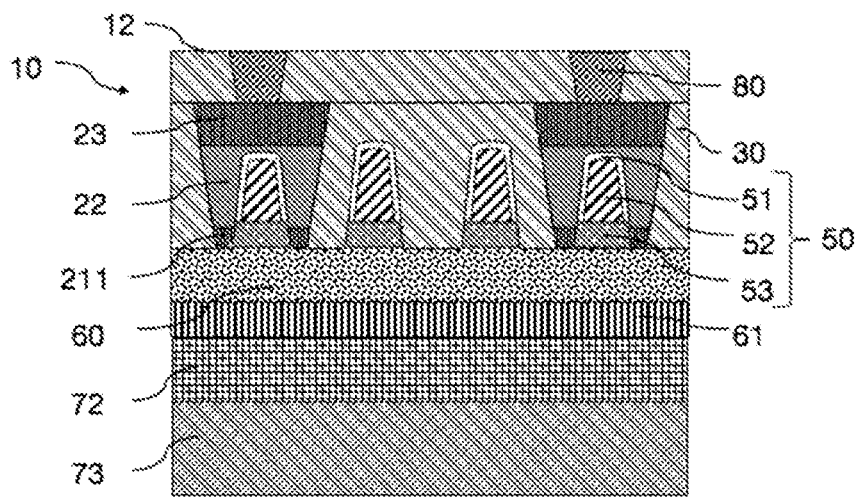
FIG. 23 is a schematic cross-sectional structural diagram of the semiconductor structure obtained after a node contact structure is formed according to an embodiment of the present disclosure.
Figure 24:
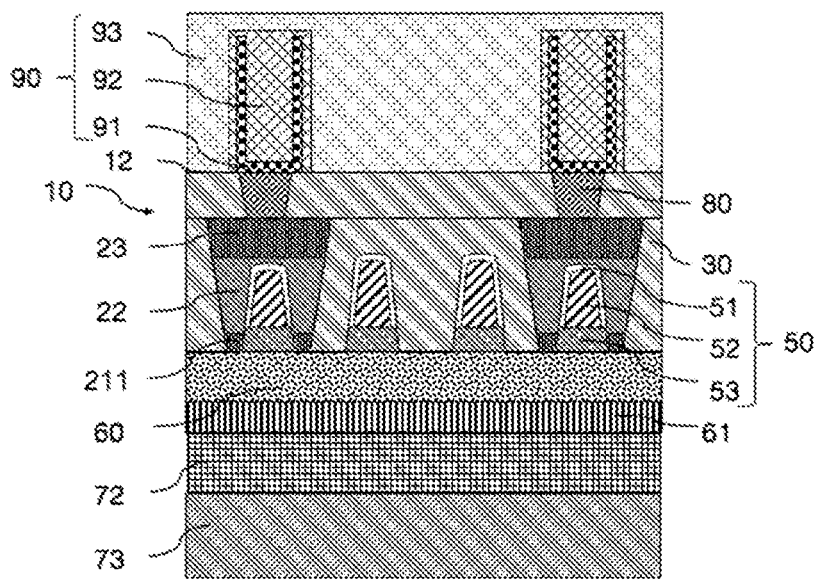
FIG. 24 is a schematic cross-sectional structural diagram of the semiconductor structure obtained after a capacitor structure is formed according to an embodiment of the present disclosure.

In some embodiments, as shown in FIGS. 22 to 24, the method for fabricating the semiconductor structure further includes:

S61: forming node contact structures on a side of the substrate close to the second surface, where the node contact structures are electrically connected to the drain region; and S62: forming a plurality of capacitor structures arranged in an array on the second surface, where the plurality of capacitor structures are connected to the active areas in one-to-one correspondence via the node contact structures.

For example, before the node contact structures are formed, a portion of the back substrate of the SOI substrate may be polished by means of the chemical mechanical polishing process, until the buried oxide layer in the SOI substrate is exposed, as shown in FIG. 22.

In Step S61, as shown in FIG. 23, a plurality of node contact structures 80 are formed in the buried oxide layer. The node contact structures 80 penetrate through the buried oxide layer and are electrically connected to the drain region 23 of the active area 20. For example, the node contact structure 80 may include, but is not limited to, a tungsten layer.

In Step S62, as shown in FIG. 24, a plurality of capacitor structures 90 arranged in an array are formed on the second surface 12. Each of the capacitor structures 90 includes a lower electrode 91, an upper electrode 93, and a capacitor dielectric layer 92 between the lower electrode 91 and the upper electrode 93, where the lower electrode 91 is electrically connected to node contact structure 80. The capacitor structures 90 are connected to the active areas 20 in one-to-one correspondence through the node contact structures 80.

In the method for fabricating the semiconductor structure, the buried word line structure 50, the bit line structure 60, and the active area 20 are arranged on a side of the substrate 10 close to the first surface 11, the capacitor structure 90 is arranged on a side of the substrate 10 close to the second surface 12, and the transistor structure and the capacitor structure 90 share the same region, such that an area occupied by a single DRAM cell is reduced, and storage density is increased. Moreover, the first region 211 and the second region 212 having the different doping types are arranged in the source region, where the first region 211 forms the transistor structure together with the channel region 22 and the drain region, and the charges accumulated in the transistor structure are released via the conductive material layer 71 by means of the second region 212. In this way, the floating body effect and the history effect are eliminated, and thus performance of the transistor structure is improved.

Figure 25:
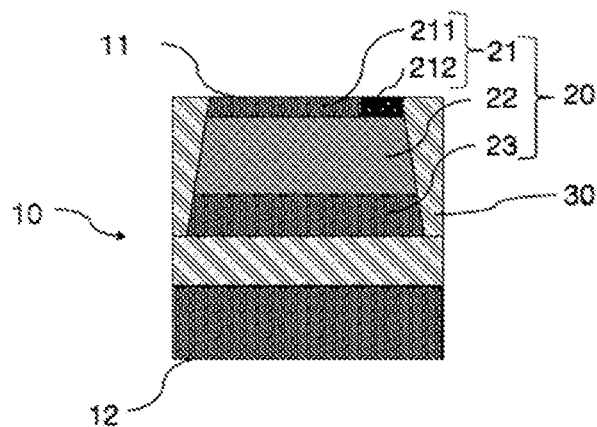
FIG. 25 is a schematic cross-sectional structural diagram of the semiconductor structure according to an embodiment of the present disclosure.

As shown in FIG. 25, one embodiment of the present disclosure discloses a semiconductor structure, including a substrate 10, which includes active areas 20 arranged in an array and an isolation structure 30 configured to isolate the active areas. The substrate 10 has a first surface 11 and a second surface 12 opposite to each other. Each of the active areas 20 includes a source region 21, a drain region 23, and a channel region 22 positioned between the source region 21 and the drain region 23, where the source region 21 is exposed to the first surface 11, and the drain region 23 and the source region 21 are not positioned on the same surface. The source region 21 includes a first region 211 and a second region 212 distributed in a horizontal direction, where the first region 211 and the second region 212 have different doping types.

In the above semiconductor structure, the source region 21 is provided with the first region 211 and the second region 212 having different doping types, where the first region 211, the channel region 22 and the drain region may together form the transistor structure, and the charges accumulated in the transistor structure are released by means of the second region 212. In this way, the floating body effect and the history effect are eliminated, and thus performance of the transistor structure is improved.

For example, the substrate 10 may include, but is not limited to, a silicon substrate or a silicon-on-insulator (SOI) substrate. The SOI substrate includes top layer silicon, a back substrate, and a buried oxide layer between the top layer silicon and the back substrate. In this embodiment, reference is made by taking an example where the SOI substrate is used as the substrate 10. As an example, the isolation structure 30 may be a shallow trench isolation (STI) structure, and a material for forming the STI structure 30 may include a silicon oxide layer. The STI structure defines a plurality of active areas 20 (AA) in the substrate 10.

Figure 26:
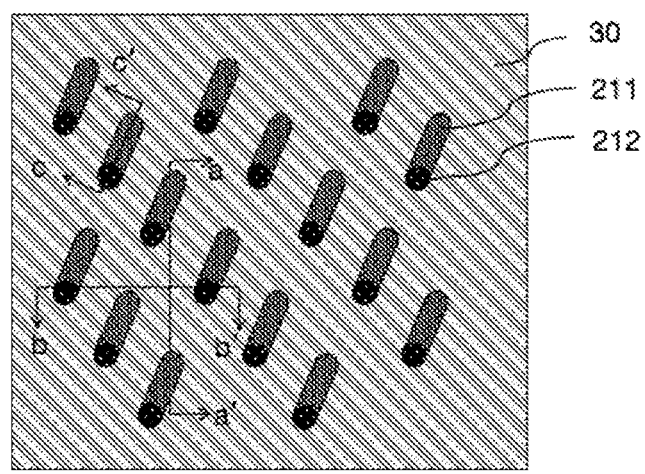
FIG. 26 is a vertical view of the semiconductor structure according to an embodiment of the present disclosure.

For example, a vertical view of the substrate 10 is shown in FIG. 26, the plurality of active areas 20 may be arranged in a staggered array, the active areas 20 are arranged in parallel with each other, and a center of one active area 20 may be adjacent to an end portion of another active area 20 adjacent thereto. FIG. 25 is a schematic cross-sectional structural diagram taken along the cc' direction in FIG. 26.

With continued reference to FIG. 25, each active area 20 includes a source region 21, a drain region 23, and channel region 22 between the source region 21 and the drain region 23, which are arranged along a vertical direction. The channel region 22 is perpendicular to the first surface 11 or the second surface 12. For example, the source region 21 is exposed to the first surface 11 of the substrate 10; and the drain region 23 is positioned inside the SOI substrate and keeps away from the first surface 11.

In some embodiments, the first region 211 of the source region 21 is heavily N-type doped, the second region 212 is heavily P-type doped, the drain region is heavily N-type doped, and the channel region 22 is P-type doped. The first region 211, the channel region 22 and the drain region together form an NPN transistor, and the second region 212 is electrically connected to the NPN transistor.

In some other embodiments, the first region 211 of the source region 21 is heavily P-type doped, the second region 212 is heavily N-type doped, the drain region 23 is heavily P-type doped, and the channel region 22 is N-type doped. The first region 211, the channel region 22 and the drain region 23 together form a PNP transistor, and the second region 212 is electrically connected to the PNP transistor.

Figure 27:
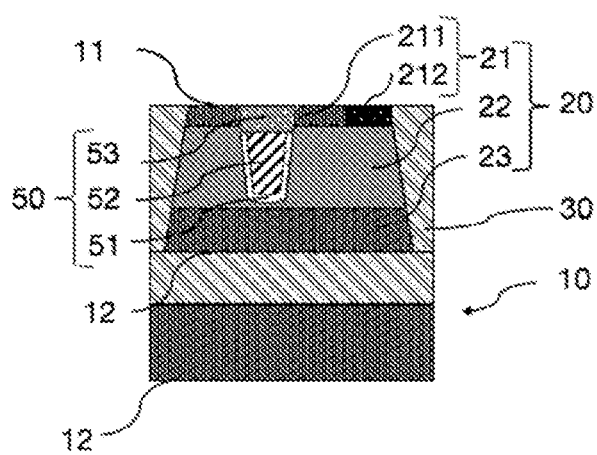
FIG. 27 is a schematic cross-sectional structural diagram of a semiconductor structure according to another embodiment of the present disclosure.

In some embodiments, as shown in FIG. 27, the semiconductor structure further includes a buried word line structure 50, which is positioned on a side of the substrate close to the first surface and is embedded in the first region 211.

FIG. 27 is a schematic cross-sectional structural diagram taken along the cc' direction in FIG. 11. As shown in FIG. 27, the buried word line structure 50 includes: a word line conductive layer 52, a gate oxide layer 51 wrapping a bottom and a side wall of the word line conductive layer 52, and a word line dielectric layer 53. The word line conductive layer 52 is embedded into the channel region 22 in the active area 20, and the gate oxide layer 51 is configured to isolate the word line conductive layer 52 from the active area 20. The word line dielectric layer 53 covers a top of the word line conductive layer 52, and a surface of the word line dielectric layer 52 close to the first surface 11 is flush with the first surface 11 and is exposed to the first surface 11 of the substrate 10.

For example, the gate oxide layer 51 may include, but is not limited to, a high dielectric constant material layer, such as a silicon oxide layer or a silicon oxynitride layer. The word line conductive layer 52 may be a metal layer with lower resistivity, such as germanium (Ge), tungsten (W), copper (Cu), or gold (Au). The word line dielectric layer 53 may be, for example, a silicon nitride layer. The word line dielectric layer 53 covers the word line conductive layer 52 and the gate oxide layer 51 inside the substrate 10, which can form a good protective effect on the word line conductive layer 52 and the gate oxide layer 51, thereby improving device stability.

In some embodiments, as shown in FIG. 14 and FIG. 18, the semiconductor structure further includes: a bit line structure 60, which is positioned on the first surface 11 of the substrate 10 and is electrically connected to the first region 211 of the source region 21; and conductive material layers 71, which are positioned on two opposite sides of the bit line structure 60 and are electrically connected to the second region 212 of the source region.

By arranging, on the two opposite sides of the bit line structure 60, the conductive material layers 71 electrically connected to the second region 212, the charges accumulated in the transistor structure may be transferred and released in time, to avoid the floating body effect and the history effect caused by accumulation of the charges in the transistor structure.

For example, FIG. 14 is a vertical view of the semiconductor structure, FIG. 15 is a schematic cross-sectional structural diagram taken along the aa' direction in FIG. 14, as can be known from FIG. 15, the bit line structure 60 is electrically connected to the first region 211. FIG. 16 is a schematic cross-sectional structural diagram taken along the bb' direction in FIG. 14, as can be known from FIG. 16, the bit line structure 60 does not pass through the second region 212, and the second region 212 is exposed to the first surface 11 of the substrate 10.

For example, the bit line structure 60 may include a metal layer and a metal barrier layer, where the metal barrier layer is positioned between the metal layer and the substrate 10. The metal layer may be, for example, a tungsten layer, and the metal barrier layer may be, for example, a titanium layer or a titanium nitride layer. The metal barrier layer can prevent interpenetration between the metal layer and silicon.

In some embodiments, as shown in FIG. 17, the side wall and the top of the bit line structure 60 are covered with the bit line dielectric layer 61, which separates the bit line structure 60 from outside to form an insulation protection for the bit line structure 60. For example, the bit line dielectric layer 61 may include, but is not limited to, a silicon nitride layer, a carbon layer, a silicon oxide layer, or a silicon oxynitride layer.

In some embodiments, as shown in FIG. 18, a conductive material layer 71 is disposed between adjacent bit line structures 60, and the conductive material layer 71 is electrically connected to the second region 212.

The conductive material layer 71 covers the first surface 11 and is electrically connected to the second region 212 exposed to the first surface 11. For example, the conductive material layer 71 is flush with the upper surface of the bit line dielectric layer 61. The conductive material layer 71 may be a metal layer with lower resistivity, such as a copper layer or a tungsten layer.

By arranging the conductive material layer 71 electrically connected to the second region 212, the charges accumulated in the transistor structure may be timely released to the conductive material layer 71; and further, the charges may also be conveniently conducted to other places via the conductive material layer 71 to avoid accumulation of the charges.

Figure 28:
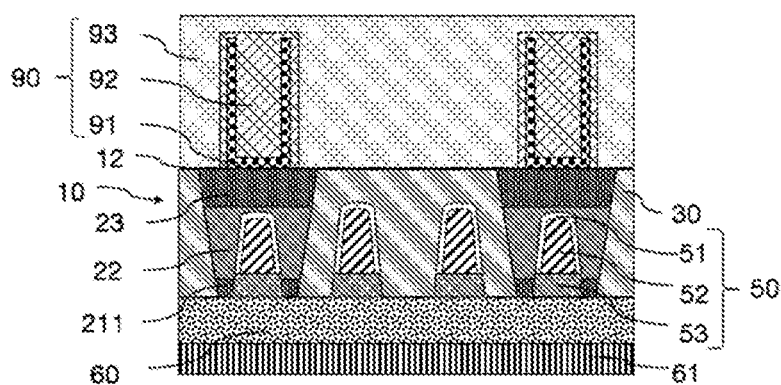
FIG. 28 is a schematic cross-sectional structural diagram of a semiconductor structure according to yet another embodiment of the present disclosure.

In some embodiments, as shown in FIG. 28, the semiconductor structure further includes: a capacitor structure 90, which is positioned on the side of the substrate 10 close to the second surface 12 and is electrically connected to the drain region 23.

For example, the drain region 23 is exposed to the second surface 12 and is directly connected to the capacitor structure 90. The capacitor structure 90 includes a lower electrode 91, an upper electrode 93, and a capacitor dielectric layer 92 positioned between the lower electrode 91 and the upper electrode 93.

Figure 29:
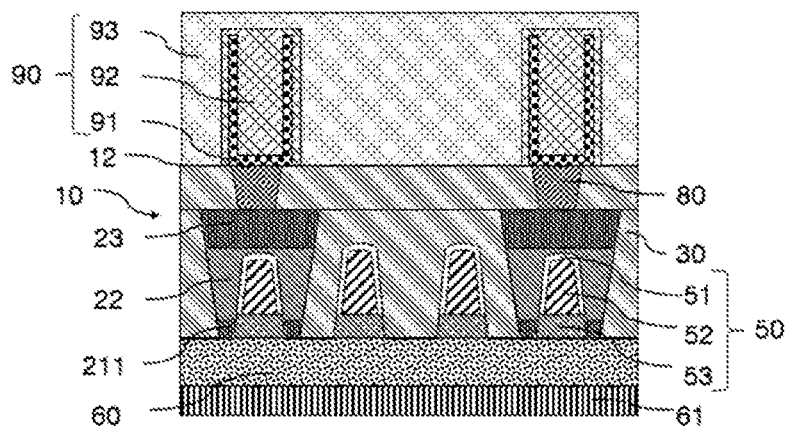
FIG. 29 is a schematic cross-sectional structural diagram of a semiconductor structure according to still another embodiment of the present disclosure.

In some embodiments, as shown in FIG. 29, node contact structures 80 are further included between the substrate 10 and the capacitor structures 90, and the node contact structures 80 are electrically connected to the drain region 23. The capacitor structures 90 are connected to the active areas 20 in one-to-one correspondence through the node contact structures 80.

For example, the node contact structures 80 are positioned in a buried oxide layer of the SOI substrate. The node contact structure 80 penetrates the buried oxide layer, one end of the node contact structure 80 is electrically connected to the drain region 23 in the active area 20, and other end of the node contact structure 80 is electrically connected to the capacitor structure 90. For example, the node contact structure 80 may include, but is not limited to, a tungsten layer.

In the above semiconductor structure, the buried word line structure 50, the bit line structure 60, and the active area 20 are arranged on a side of the substrate 10 close to the first surface 11, the capacitor structure 90 is arranged on a side of the substrate 10 close to the second surface 12, and the transistor structure and the capacitor structure 90 share the same region, such that an area occupied by a single DRAM cell is reduced, and storage density is increased. Moreover, the first region 211 and the second region 212 having the different doping types are arranged in the source region, where the first region 211 forms the transistor structure together with the channel region 22 and the drain region, and the charges accumulated in the transistor structure are released via the conductive material layer 71 by means of the second region 212. In this way, the floating body effect and the history effect may be eliminated, and thus performance of the transistor structure is improved.

One embodiment of the present disclosure further discloses a semiconductor device, including the semiconductor structure in any one of the above embodiments. For example, the above semiconductor device may be a DRAM device with a unit area of $4F^2$. Compared with conventional DRAM device structures, the above semiconductor device has higher storage density and breakover current, and can timely release the charges accumulated in the transistor structure, thereby eliminating the floating body effect and the history effect existing in the conventional structures, and improving the performance of the semiconductor device.

It is to be understood that although the steps in the flowchart of FIG. 1 are sequentially displayed as indicated by the arrows, these steps are not necessarily sequentially performed in the order indicated by the arrows. Unless expressly stated herein, the execution of these steps is not strictly restrictive and may be performed in other order. Moreover, at least a part of the steps in FIG. 1 may include multiple steps or multiple stages. These steps or stages are not necessarily performed at the same moment, but may be executed at different moments, and the order of execution of these steps or stages is not necessarily performed sequentially, but may be performed alternately or alternately with at least a part of the steps or stages of other steps or other steps.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be merely limited by the appended claims.

What is claimed is:

1. A semiconductor structure, comprising:
a substrate comprising active areas arranged in an array and an isolation structure configured to isolate the active areas, the substrate having a first surface and a second surface opposite to each other, and each of the active areas comprising a source region, a drain region, and a channel region positioned between the source region and the drain region; and
the source region is exposed to the first surface, the drain region and the source region being not positioned on the same surface;
wherein the source region comprises a first region and a second region distributed in a horizontal direction, the first region and the second region having different doping types.

2. The semiconductor structure according to claim 1, further comprising:
a buried word line structure positioned on a side of the substrate close to the first surface, the buried word line structure being embedded in the first region.

3. The semiconductor structure according to claim 2, wherein the buried word line structure comprises:
a word line conductive layer and a gate oxide layer wrapping a bottom and a side wall of the word line conductive layer, the word line conductive layer being embedded into the channel region in each of the active areas, and the gate oxide layer being configured to isolate the word line conductive layer from the active areas; and
a word line dielectric layer covering a top of the word line conductive layer, a surface of the word line dielectric layer close to the first surface being flush with the first surface and being exposed to the first surface of the substrate.

4. The semiconductor structure according to claim 1, further comprising:
a bit line structure positioned on the first surface of the substrate, the bit line structure being electrically connected to the first region of the source region; and
conductive material layers positioned on two opposite sides of the bit line structure, the conductive material layers being electrically connected to the second region of the source region.

5. The semiconductor structure according to claim 1, further comprising:
a capacitor structure positioned on a side of the substrate close to the second surface, the capacitor structure being electrically connected to the drain region.

6. The semiconductor structure according to claim 5, wherein the drain region is exposed to the second surface and is directly connected to the capacitor structure.

7. The semiconductor structure according to claim 5, wherein the drain region is not exposed to the second surface; and between the substrate and the capacitor structures, the semiconductor structure further comprises:
node contact structures electrically connected to the drain region; wherein
the capacitor structures are connected to the active areas in one-to-one correspondence via the node contact structures.

8. The semiconductor structure according to claim 1, wherein the channel region in each of the active area is perpendicular to the first surface or the second surface.

9. The semiconductor structure according to claim 1, wherein the drain region is heavily N-type doped, the first region being heavily N-type doped, the second region being heavily P-type doped, and the channel region being P-type doped; and
the drain region is heavily P-type doped, the first region being heavily P-type doped, the second region being heavily N-type doped, and the channel region being N-type doped.

10. A method for fabricating a semiconductor structure, comprising:
providing a substrate having a first surface and a second surface opposite to each other; and
forming, in the substrate, active areas arranged in an array and an isolation structure configured to isolate the active areas, each of the active areas comprising a source region, a drain region, and a channel region positioned between the source region and the drain region;
wherein the source region is exposed to the first surface, the source region comprising a first region and a second region distributed in a horizontal direction, the first region and the second region having different doping types, and the drain region and the source region being not positioned on the same surface.

11. The method for fabricating the semiconductor structure according to claim 10, further comprising:
forming a buried word line structure extending along a first direction in the substrate, the buried word line structure being positioned on a side of the substrate close to the first surface and being embedded in the first region.

12. The method for fabricating the semiconductor structure according to claim 11, wherein the forming the buried word line structure extending along the first direction in the substrate comprises:
forming a patterned mask layer on the first surface;
forming a word line trench in the substrate on a basis of the patterned mask layer, the word line trench intersecting with the first region, and a bottom of the word line trench extending to the channel region;
forming, in the word line trench, a word line conductive layer and a gate oxide layer wrapping a bottom and a side wall of the word line conductive layer; and
forming a word line dielectric layer to cover a top of the word line conductive layer.

13. The method for fabricating the semiconductor structure according to claim 11, wherein:
before the buried word line structure is formed, a first type of doping is performed on the source region and the channel region; and
after the buried word line structure is formed, a second type of heavy doping is performed on the first region, and a first type of heavy doping is performed on the second region.

14. The method for fabricating the semiconductor structure according to claim 13, further comprising:
forming a bit line structure extending along a second direction on the first surface, the bit line structure being electrically connected to the first region, and the second direction intersecting with the first direction; and
forming conductive material layers on two opposite sides of the bit line structure, the conductive material layers being electrically connected to the second region.

15. The method for fabricating the semiconductor structure according to claim 14, wherein after forming the conductive material layers, the method further comprises:
forming a metal interconnect layer, the metal interconnect layer covering the bit line structure and the conductive material layers; and
bonding an obtained structure to a support substrate, wherein a surface of the metal interconnect layer away from the substrate is a bonding surface.

16. The method for fabricating the semiconductor structure according to claim 10, further comprising:
forming node contact structures on a side of the substrate close to the second surface, the node contact structures being electrically connected to the drain region; and
forming a plurality of capacitor structures arranged in an array on the second surface, the plurality of capacitor structures being connected to the active areas in one-to-one correspondence via the node contact structures.

* * * * *